United States Patent [19]

Chang

[11] Patent Number: 5,457,060
[45] Date of Patent: Oct. 10, 1995

[54] PROCESS FOR MANUFACTUIRNG MOSFET HAVING RELATIVELY SHALLOW JUNCTION OF DOPED REGION

[75] Inventor: Wen-Yueh Chang, Hsinchu, Taiwan

[73] Assignee: Winbond Electronics Corporation, Taiwan

[21] Appl. No.: 262,543

[22] Filed: Jun. 20, 1994

[51] Int. Cl.⁶ .................. H01L 21/265; H01L 21/275; H01L 21/336
[52] U.S. Cl. .................. 437/34; 437/37; 437/44; 437/57; 437/151; 437/154
[58] Field of Search .................. 437/37, 44, 141, 437/909, 154, 151, 34, 57

[56]  References Cited
U.S. PATENT DOCUMENTS 5,108,940  4/1992  Williams .................. 437/44
5,264,380 11/1993  Pfiester .................. 437/37
5,270,235 12/1993  Ito ....................... 437/45
5,270,237 12/1993  Sang ..................... 437/52

Primary Examiner—Olik Chaudhuri
Assistant Examiner—Richard A. Booth
Attorney, Agent, or Firm—Bacon & Thomas

[57]  ABSTRACT

A process for manufacturing a MOSFET having a shallow junction of a doped region includes preparing an intermediate wafer product, applying an oxide layer on said intermediate wafer product, introducing into a dopant around an interface between said oxide layer and said intermediate wafer product, and driving said dopant into said intermediate wafer product to form a MOSFET having a relatively shallow junction of a doped region. This invention offers a simplified, efficient, and cost-effective process to obtain a MOSFET having a relatively shallow junction of a doped region and being free from electrical leakage possibly occurred at the junction.

17 Claims, 5 Drawing Sheets 5,457,060

PROCESS FOR MANUFACTUIRNG MOSFET HAVING RELATIVELY SHALLOW JUNCTION OF DOPED REGION

FIELD OF THE INVENTION

This invention generally relates to a process for manufacturing a MOSFET, more particularly to a process for manufacturing a MOSFET having a relatively shallow junction of a doped region and more specifically to a process for manufacturing a MOSFET having relatively shallow junctions of a source and a drain.

BACKGROUND OF THE INVENTION

Since the first one integrated circuit was appeared in 1959, the number of IC chips fabricated on a wafer has been dramatically increased year by year. It is known that the size of each IC chip can be successfully minimized by improving the technique for the IC fabrication. However, when the length of the channel in a MOSFET is shortened, a short-channel effect is accordingly caused because of the occurrence of the phenomena of a two-dimensional potential distribution, a high electrical field conduction, and the generation of the electrical charges within an oxide layer in the MOSFET.

So far as a specific dopant concentration in the channel is concerned, when the size of the MOSFET is reduced, which means that the channel length is correspondingly shortened, two depletion regions formed close to the interface of the source and the drain are possible with each other since the sum of the widths of the two depletion regions is merely approximately equal to the length of the channel, and the potential distribution within the channel is two-dimensional. As a result, the MOSFET will degenerate on the sub-critical characteristic thereof, change the critical voltage thereof due to changes, in the length of the channel and the applied bias, and lose the original function of the transistor because the two depletion regions thereof are interconnected.

Furthermore, owing to the shortening of the channel, the electrical field in the channel increases. The mobility of carriers in the channel increases with the increase of the electrical field until it reaches a saturation value. If the electrical field continuously increases, the amount of the carriers will be multiplied at a region near the drain to result in an effect of parasitic bipolar junction transistor due to the occurrence of the substrate current generated thereby. The increased electrical field will also cause hot carriers to be introduced into the gate oxide and thus results in reliability problems of the charged gate oxide, the continuous shift of the threshold voltage, and the degeneration of the transconductance thereof.

Short-channel effects make the characteristics degeneration and the reliability of the transistor device even worse. In the sub-micron MOSFET manufacturing process, it is required to have a shallow depth for the source or the drain junction of a MOSFET to prevent its depletion regions from mutual punch-through and to eliminate the adverse influences caused by short-channel effect resulting from two-dimensional distribution of the potential.

The formation of the lightly doped drain (LDD) region may be helpful to deal with the above-described situation. Two LDD regions are formed respectively between the source and the channel and between the drain and the channel. The LDD regions are sufficient to reduce the electrical field in the channel to solve the reliability problems caused by the high electrical field conductance effect and by the generation of hot carriers, and to reduce the short-channel effect as well.

Take an n-channel MOSFET for example. The prior manufacturing process for fabricating a MOSFET includes steps of:

(1) preparing a p-type wafer as a substrate 10;

(2) introducing p-type field ions to form a p-type isolation region 11 into the substrate 10 by ion implantation;

(3) growing an field oxide 12 on the p-type isolation region 11;

(4) growing a thin $S_iO_2$, layer as a gate oxide 13 on the substrate 10 through a thermal oxidation;

(5) depositing a polycrystalline silicon layer on the gate oxide 13;

(6) defining a gate region 14 by a mask; and (7) etching the polycrystalline silicon other than the masked gate region to obtain a gate 14. The obtained intermediate wafer product having a gate thereon is shown in FIG. 1.

After the above-mentioned steps, two LDD regions of the source and the drain are formed on the intermediate wafer product, as shown in FIG. 2. The prior process includes implanting the low concentration n-dopant to form LDD regions 21, as shown in FIG. 2a, through ion implantation, depositing a $S_iO_2$ layer 22 on the intermediate wafer product by chemical vapor deposition (CVD), as shown in FIG. 2b, anisotropically etching the intermediate wafer product to form a side-wall oxide 23 beside the gate 14, as shown in FIG. 2c, implanting high concentration n-type ions to form a source and a drain 24 with small residual LDD regions 25 formed under the side-wall oxide 23, as shown in FIG. 2d, and depositing a polysilicon metal dielectric (PMD) on the whole wafer. A backend thermal budget (or backend thermal cycle) is also used to planerize the dielectric. Of course, the source, the drain, and two LDD regions are therefore driven much deeper into the wafer, as shown in FIG. 2e.

As what is mentioned above, the prior technique is unaffordable to fabricate a MOSFET having a shallow junction for the source or the drain. Three possible methods for solving this problem are respectively described as follows:

(1) Reduction of the backend thermal budget:

This method is most adopted in the fabrication of the MOSFET. However, if the PMD is planerized by the normal borophosphorous silicate glass (BPSG) reflow procedure, it is limited to reduce the thermal budget and it is improper for this procedure to fabricate a MOSFET having a size of less than 0.35 [t. Another feasible ways are to adopt a deposition process using ozone and tetra ethyl ortho silicate (TEOS), a spin on glass (SOG) process which is a process to uniformly coat a dielectric layer on the wafer in a spinning way, a photoresistor etch back process, or a chemical mechanical polishing (CMP) process. Unfortunately, these processes are either over-expensive or still under development.

(2) Pre-amorphousrizing the surface of the silicon wafer to reduce the projecting range of the doping ions to be implanted before forming the source and drain:

This method is impractical because junction leakage always occurs and the depth of the junction for the source or the drain is also affected by the backend thermal budget.

(3) Forming a source or a drain by solid state diffusion,

This method is to use a doped polycrystalline silicon, a doped polycide, or a doped silicon dioxide as a diffusion source and make the dopant in the diffusion source be diffused into the source or the drain by a backend thermal budget. A shallow junction of the source or the drain is obtained thereby, and on the other hand, the damage caused by the ion-implantation in the source or drain is avoided. The restriction is that this method can only be used for manufacturing a source or a drain, but it is impossible to form thereby an LDD region. The short-channel effect can be effectively reduced only when the depth of the junction of the LDD region is made shallow. Therefore, this method is not advantageous.

SUMMARY OF THE INVENTION

An object of the present invention is to offer a method to obtain a MOSFET having a shallow junction of a source or a drain.

Another object of the present invention is to offer a method to form a source, a drain, and an LDD region simultaneously in a MOSFET.

Another object of the present invention is to offer a method capable of effectively reducing the short-channel effect possibly occurred in a MOSFET.

In accordance with the present invention, a process for manufacturing a MOSFET having a relatively shallow junction of a doped region comprises (a) preparing an intermediate wafer product, (b) applying an oxide layer on the intermediate wafer product, (c) introducing into a dopant around an interface between the oxide layer and the intermediate wafer product and (d) driving the dopant into the intermediate wafer product to form a MOSFET having a relatively shallow junction of a doped region.

In accordance with another aspect of the present invention, the preparing step (a) comprises (1a) preparing a wafer as a substrate, (2a) growing a field oxide layer on the substrate, (3a) growing a gate oxide layer on the substrate, and (4a) forming a gate on the gate oxide layer.

In accordance with another aspect of the present invention, the wafer is an n-type substrate for fabricating a p-channel transistor or a p-type substrate for fabricating an n-channel transistor.

In accordance with another aspect of the present invention, the p-type substrate is pre-doped with p-type field ions to increase a field threshold of the n-channel transistor.

In accordance with another aspect of the present invention, the field oxide layer is a $SiO_2$, layer, the gate oxide layer is a $SiO_2$, layer, and the oxide layer is a $SiO_2$, layer.

In accordance with another aspect of the present invention, the gate is made of one selected from a group consisting of a polycrystalline silicon and metal silicides.

In accordance with another aspect of the present invention, the applying step (b) is executed by a deposition process.

In accordance with another aspect of the present invention, the deposition process is a chemical vapor deposition process.

In accordance with another aspect of the present invention, the introducing step (c) is executed by an ion implantation process.

In accordance with another aspect of the present invention, the dopant is an n+ ion for a p-type substrate or an p+ ion for an n-type substrate.

In accordance with another aspect of the present invention, the driving step (d) is capable of resulting in a required dopant distribution in the substrate and is executed by a thermal cycle process.

In accordance with another aspect of the present invention, two lightly doped regions and two heavily doped regions are formed by the introducing step (d).

In accordance with another aspect of the present invention, the two lightly doped regions are formed under the gate.

In accordance with another aspect of the present invention, the two heavily doped regions are a source and a drain.

In accordance with another aspect of the present invention, the process is to manufacture a complementary MOSFET and the preparing step (a) comprises (1a') preparing a wafer as a substrate, (2a') forming twin wells on the substrate, (3a') forming a p-type field ion isolation region on the substrate, (4a') growing a field oxide layer on the field ion isolation region-formed substrate, (5a') growing a gate oxide layer on the substrate, and (6a') forming a gate on the gate oxide layer.

In accordance with another aspect of the present invention, the twin wells are an n-type well and a p-type well.

In accordance with another aspect of the present invention, the forming step (3a') is executed by doping p-type field ions into the p-type well to increase a field threshold of the p-type well.

In accordance with another aspect of the present invention, the relatively shallow junction of the doped region has a depth which ranges from about 0.1 μm to about 0.2 μm.

The present invention may be best understood through the following description with reference to the accompanying drawings, in which:

DETAILED DESCRIPTION OF THE PREFERRED EMBODIMENT

This invention adopts a fore step the same as that of the prior process to manufacture the intermediate wafer product having a gate thereon. The steps of the present invention different from the prior art begin with the formation of the LDD regions. An n-channel MOSFET is illustrated hereinafter as an example.

Figure 1:
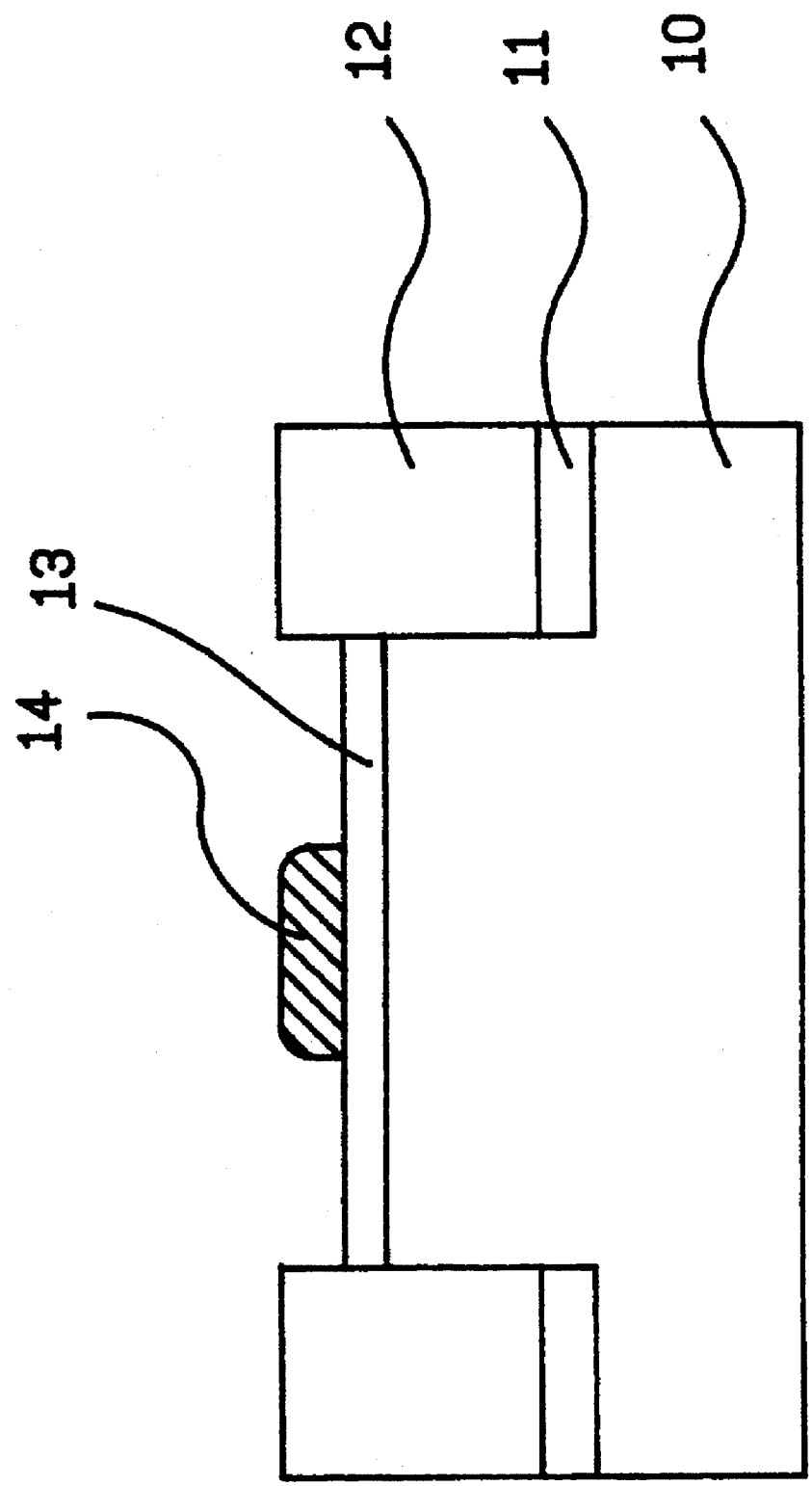
FIG. 1 is a schematic sectional view of an intermediate wafer product of an n-channel MOSFET obtained by the prior techniques.
Figure 2A:
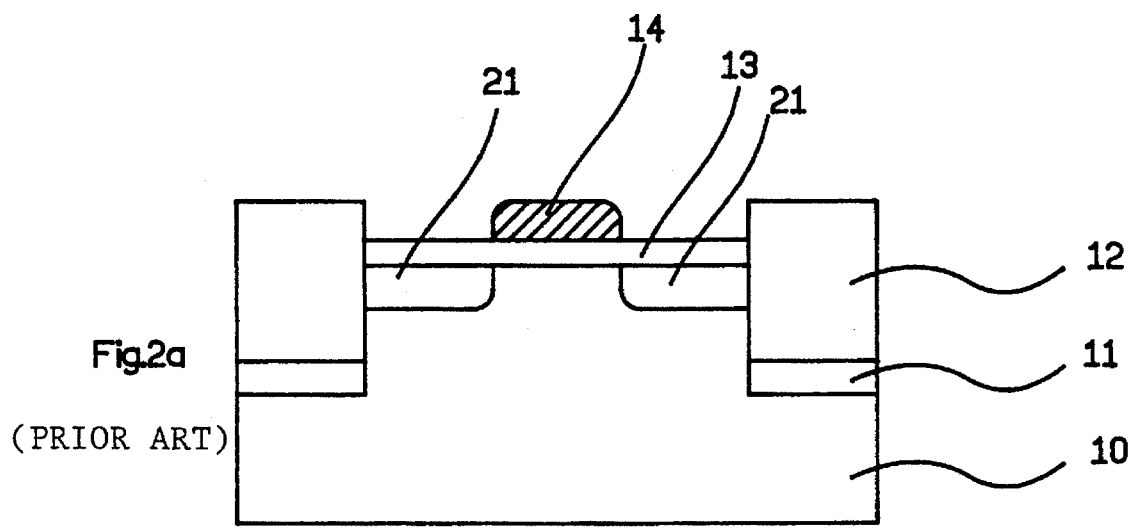
FIGS. 2a–2e are schematic sectional views of an n-channel MOSFET product fabricated from an intermediate wafer product shown in FIG. 1 by the prior techniques.
Figure 2B:
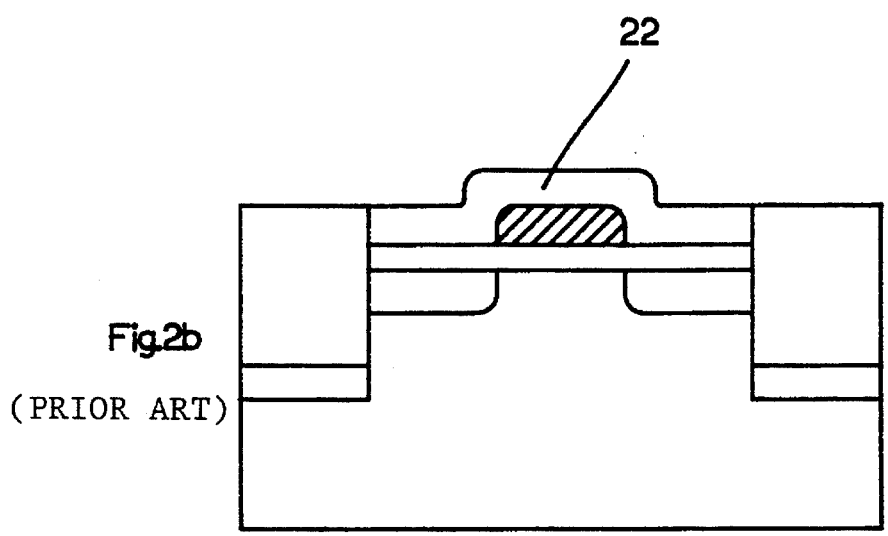
Figure 2C:
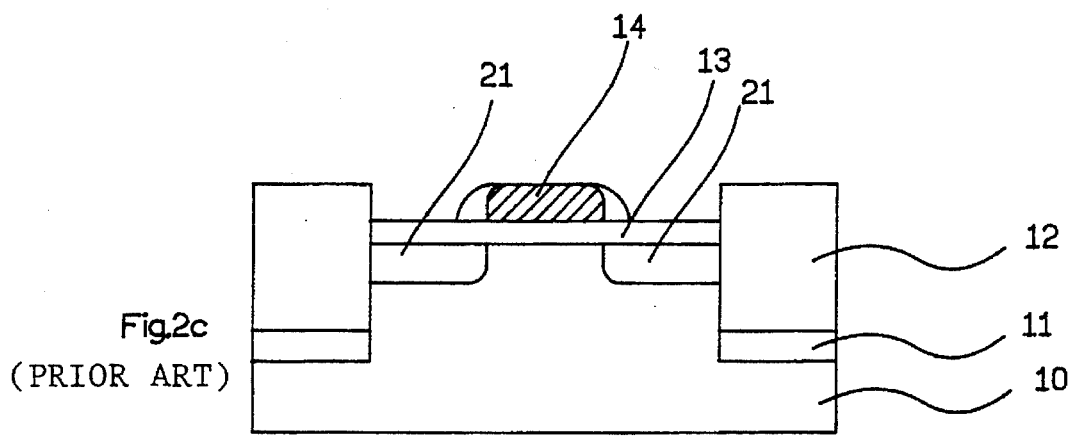
Figure 2D:
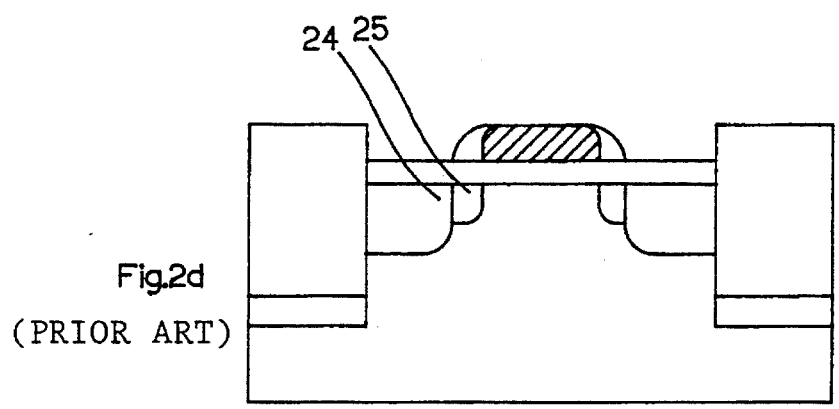
Figure 2E:
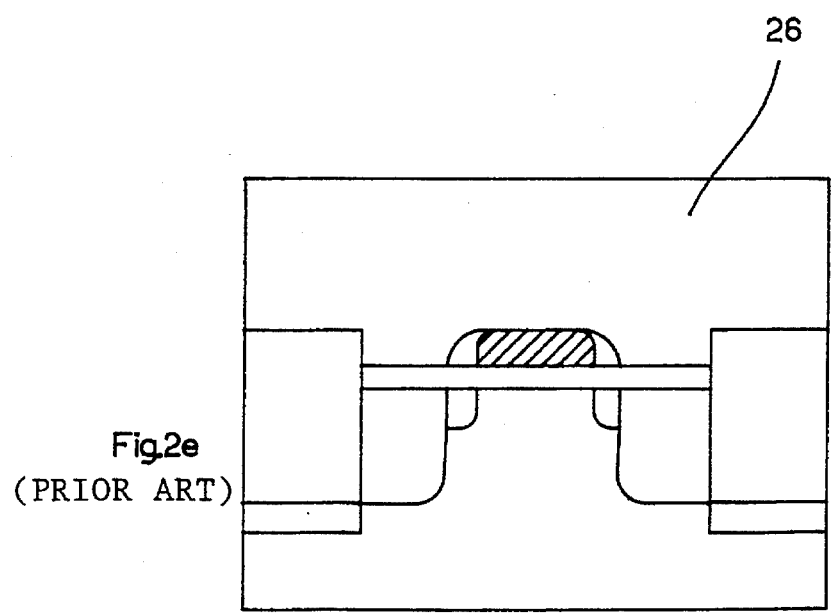
Figure 3A:
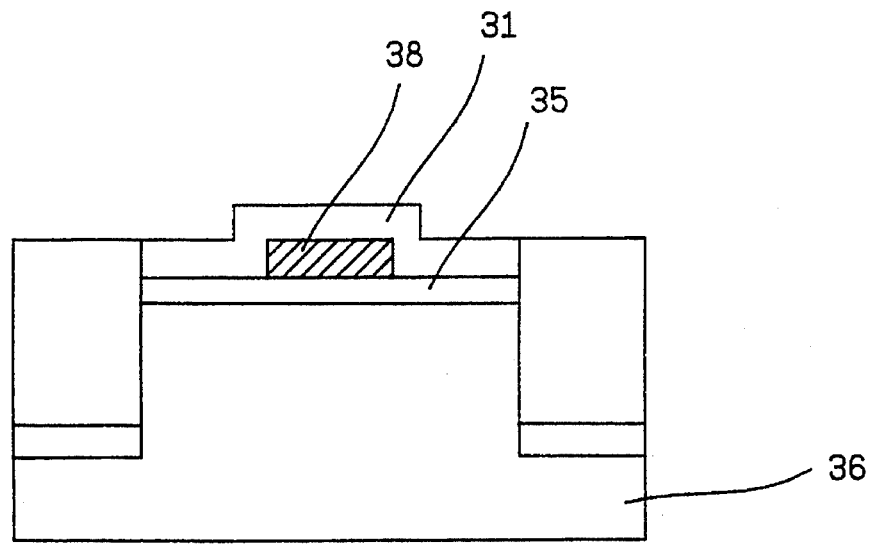
FIGS. 3a–3c are schematic sectional views of an n-channel MOSFET product according to this invention.
Figure 3B:
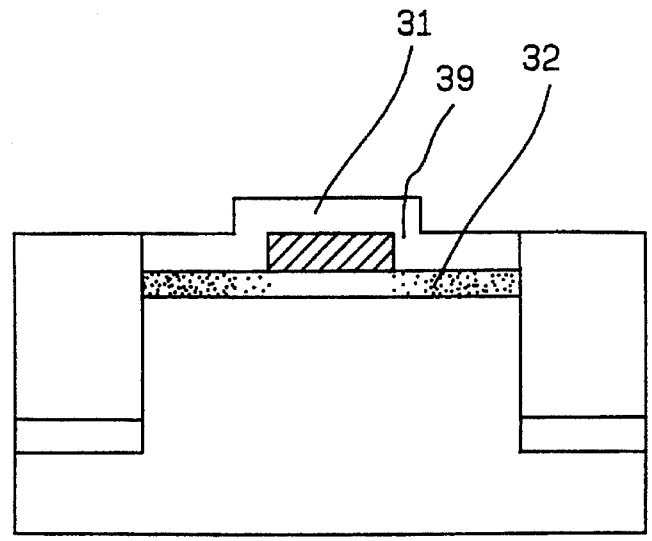
Figure 3C:
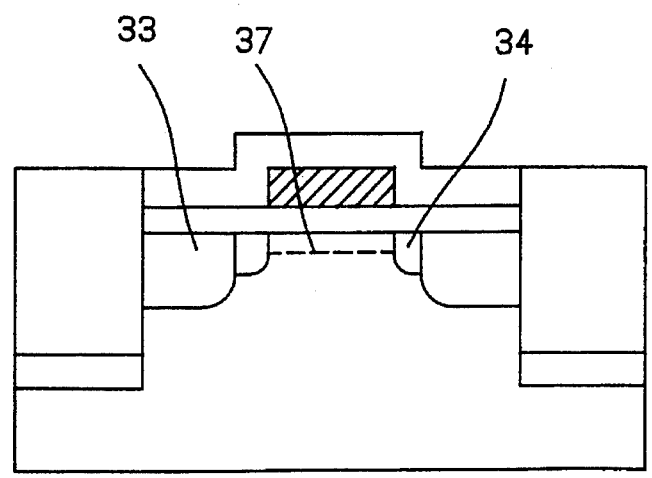

As shown in FIG. 3a, an oxide layer 31, e.g., an $SiO_2$ layer, is deposited on an intermediate wafer product of the type shown in FIG. 1, by a CVD process, and high concentration n-type dopants 32 are further introduced into the gate oxide 35 so as to be present around an interface of the gate oxide 35 and the substrate 36, as shown in FIG. 3b. Finally, we drive the n-dopants into the substrate 36 by a backend thermal budge to form a source and a drain regions 33 and two LDD regions 34, as shown in FIG. 3c.

Two LDD regions 34 are respectively located between the source 33 and the channel 37 and between the drain 33 and the channel 37. The oxide layer 31 adjacent to both sides of the polycrystalline silicon gate 38, which is particularly called spacer oxide 39, is thicker than the remaining part. Therefore, the dosage of the dopant 32 introduced into the region around the interface between the spacer oxide 39 and the substrate 36 is light and, after the dopant is driven into the substrate 36, the LDD regions 34 are accordingly formed.

Furthermore, unlike the prior processes of reducing the backend thermal budget for the sake of preventing the junctions of the doped regions from being further driven into the substrate 36, in this invention the source 33, the drain 33, and the LDD regions 34 are simultaneously diffused by the backend thermal budget process. As a result, shallow junctions of the source 33, the drain 33, and the LDD regions 34 are thereby achieved.

This invention is also suitable for manufacturing a p-channel MOSFET, or a CMOSFET forming on either an n-type substrate or a p-type substrate and having shallow junctions of the doped regions such as the source, the drain, and two LDD regions.

The present invention will now be described more specifically with reference to the embodiments. It is to be noted that the following descriptions of the preferred embodiments of this invention are presented herein for purpose of illustration and description only; it is not intended to be exhaustive or to be limited to the precise form disclosed.

Figure 4:
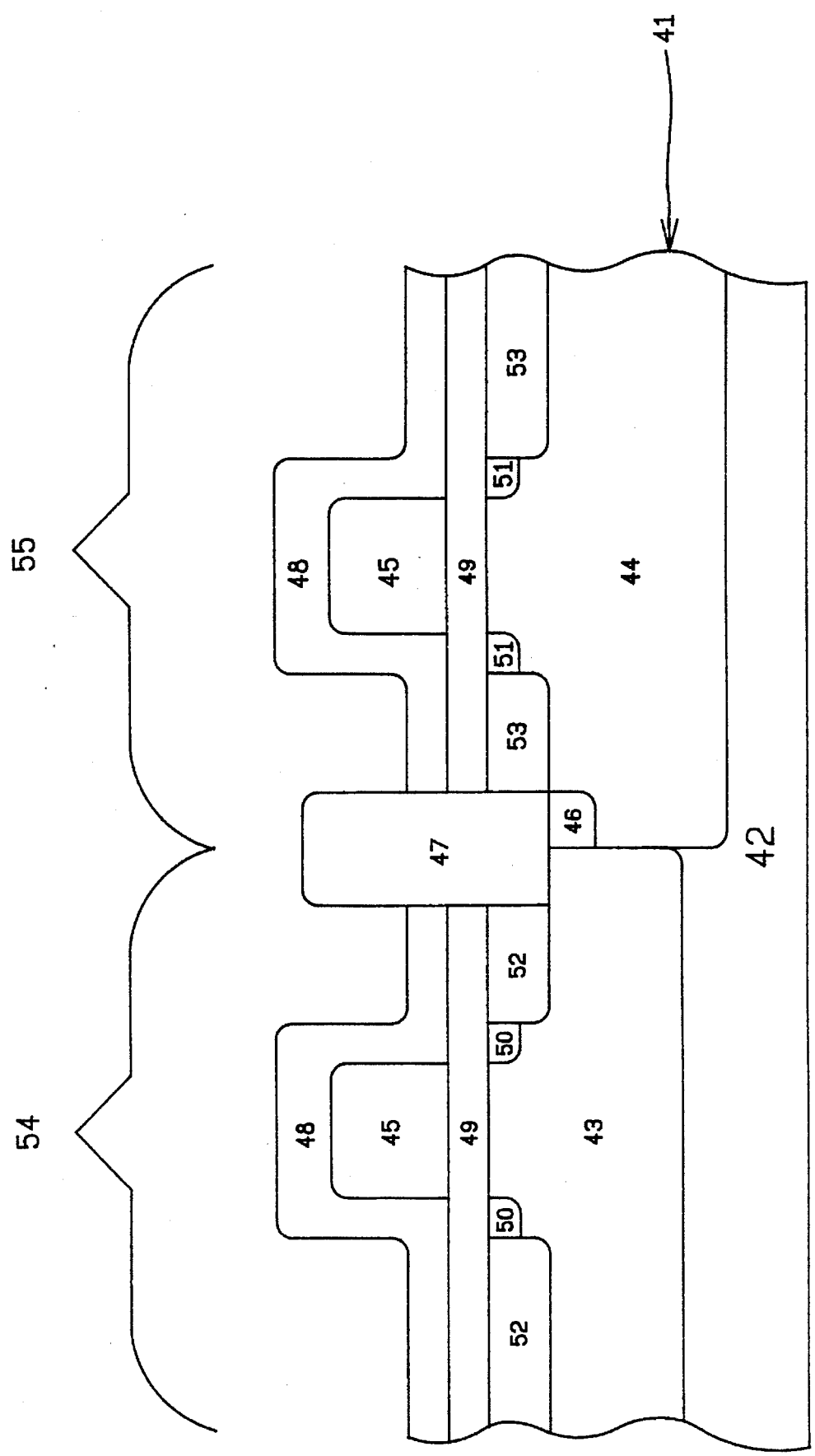
FIG. 4 is a schematically structural view showing a CMOSFET manufactured according to the present invention.

The fabrication procedure of a CMOSFET as shown in FIG. 4, having shallow junctions of doped regions according to the present invention is as follows:

Prepare an intermediate wafer product 41 having either an n-type or p-type substrate 42, and twin-wells, i.e. an n-well 43 and a p-well 44 and two gates 45 thereon. During the period for preparing the intermediate wafer, a p-type isolation layer 46 and a field oxide layer 47 are formed at the p-well region. Grow an oxide layer, i.e. a spacer oxide layer 48, having a thickness of about 600 Å on both n-well 43 and p-well 44 of the intermediate wafer product 41. Then, introduce p- and n-type dopants respectively into the regions around the junctions between the gate oxide 49 and the n- and p-wells 43 and 44, by ion implantation. The applied voltages for doping an n-type dopant, e.g. As, into the p-well 43 and doping a p-type dopant, e.g. B, into the n-well 44 are respectively about 130 KeV and 100 KeV, and the concentrations of the implanted As and B are about $3\times10^{15}$ atoms/$cm^2$ and $3\times1015$ atoms/$cm^2$ respectively. After being proceeded by a backend thermal budget, the implanted p- and n-type dopants are driven further into the n- and p-wells 43 and 44 to form respective LDD regions 50 and 51, and respective heavily doped regions 52 and 53, i.e. sources and drains, of a PMOS 54 and an NMOS 55 respectively on the n- and p-wells 43 and 44. The backend thermal budget is executed at a temperature of about 900° C. The junctions of the LDD regions 50 and 51 of PMOS 54 and NMOS 55 are thus only driven to relatively shallow depths of about 0.2 μm and μm respectively.

To sum up, this invention has the following advantages:
1. The steps for introducing low-concentration dopants and photo masking are eliminated;
2. The step for anisotropically etching the surface of the side-wall oxide is eliminated and it can minimize the loss of the field oxide and hence reduce the occurrence of the junction leakage;
3. The oxidation step for the source and the drain is skipped;
4. Simultaneously driving dopants into the substrate to form LDD regions, the source, and the drain can easily achieve the shallow junction requirement by way of a known backend thermal budget process, e.g. a BPSG flow and reflow process for smoothing the surface of the substrate and forming a smooth contact window thereon; and
5. The damage to the Si substrate caused by directly implanting the dopant thereinto is prevented and the junction leakage is reduced thereby.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for manufacturing a MOSFET having a relatively shallow junction of a doped region comprising the steps of:

(a) preparing a wafer as a substrate;

(b) growing a field oxide layer on said substrate;

(c) growing a gate oxide layer on said substrate;

(d) forming a gate on said gate oxide layer to obtain an intermediate wafer product;

(e) applying an oxide layer on said gate and gate oxide layer of said intermediate wafer product;

(f) introducing a dopant into said gate oxide layer; and (g) driving said dopant into said substrate of said intermediate wafer product to obtain a MOSFET having a relatively shallow junction of a doped region which includes two lightly doped and two heavily doped regions.

2. A process as claimed in claim 1, wherein said wafer is an n-type substrate for fabricating a p-channel transistor.

3. A process as claimed in claim 1, wherein said wafer is a p-type substrate for fabricating an n-channel transistor.

4. A process as claimed in claim 3, wherein said p-type substrate is pre-doped with p-type ions to increase a field threshold of said n-channel field transistor.

5. A process as claimed in claim 1, wherein said gate is made of one selected from the group consisting of polycrystalline silicon and metal silicides.

6. A process as claimed in claim 1, wherein said step (e) is executed by a deposition process.

7. A process as claimed in claim 6, wherein said deposition process is a chemical vapor deposition process.

8. A process as claimed in claim 1, wherein said step (f) is executed by an ion implantation process.

9. A process as claimed in claim 1, wherein said dopant is an n+ ion for a p-type substrate.

10. A process as claimed in claim 1, wherein said dopant is an p+ ion for an n-type substrate.

11. A process as claimed in claim 1, wherein said step (g) is executed by a thermal budget process.

12. A process as claimed in claim 1, wherein said two lightly doped regions are formed under a gate.

13. A process as claimed in claim 1, wherein said two heavily doped regions are a source and a drain.

14. A process for manufacturing a CMOS having a relatively shallow junction of a doped region, comprising the steps of:

(a) preparing a wafer as a substrate;

(b) forming twin wells in said substrate;

(c) forming a p-type ion isolation region on said substrate;
(d) growing a field oxide layer on said p-type ion isolation region;
(e) growing a gate oxide layer on said substrate;
(f) forming a gate on said gate oxide layer to obtain an intermediate wafer product;
(g) applying an oxide layer on said gate and gate oxide layer of said intermediate wafer product;
(h) introducing a dopant into said gate oxide layer; and
(i) driving said dopant into said substrate of said intermediate wafer product to obtain a CMOS having a relatively shallow junction of a doped region which includes two lightly doped and two heavily doped regions.

15. A process as claimed in claim 14, wherein said twin wells are an n-type well and a p-type well.

16. A process as claimed in claim 14, wherein said step (c) is executed by doping p-type ions into said p-type well to increase a field threshold of said p-type well.

17. A process as claimed in claim 14, wherein said shallow junction of said doped region has a depth ranging from about 0.1 µm to about 0.2 µm.

* * * * *